(12) United States Patent
Maezono et al.

(10) Patent No.: US 11,043,399 B2
(45) Date of Patent: Jun. 22, 2021

(54) SUBSTRATE PROCESSING APPARATUS AND OPERATION METHOD OF SUBSTRATE PROCESSING APPARATUS

(71) Applicant: Tokyo Electron Limited, Tokyo (JP)

(72) Inventors: Tomiyasu Maezono, Koshi (JP); Sadamichi Mori, Koshi (JP); Kouji Takuma, Koshi (JP); Chikara Nobukuni, Koshi (JP); Keigo Satake, Koshi (JP); Shinji Sugahara, Koshi (JP); Masahiro Yoshida, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/728,136

(22) Filed: Dec. 27, 2019

(65) Prior Publication Data
US 2020/0211867 A1 Jul. 2, 2020

(30) Foreign Application Priority Data

Dec. 28, 2018 (JP) .............................. JP2018-248011

(51) Int. Cl.
*B08B 3/08* (2006.01)
*H01L 21/67* (2006.01)
*H01L 21/687* (2006.01)

(52) U.S. Cl.
CPC .......... *H01L 21/67051* (2013.01); *B08B 3/08* (2013.01); *H01L 21/67248* (2013.01); *H01L 21/68764* (2013.01); *B08B 2203/007* (2013.01)

(58) Field of Classification Search
CPC ......... H01L 21/67051; H01L 21/67248; H01L 21/68764; H01L 21/67253; H01L 21/67173; H01L 21/67028; H01L 21/67017; H01L 21/6715; H01L 21/67155; B08B 3/08; B08B 2203/007
See application file for complete search history.

(56) References Cited

U.S. PATENT DOCUMENTS 9,073,103 B2* 7/2015 Morita .............. H01L 21/67173
9,305,767 B2* 4/2016 Nishi ................ H01L 21/67051
(Continued)

FOREIGN PATENT DOCUMENTS

JP 2007-123393 A 5/2007

*Primary Examiner* — Alexander Markoff
(74) *Attorney, Agent, or Firm* — Pearne & Gordon LLP (57) ABSTRACT

A plasma processing apparatus includes a storage; processors; a liquid supply which supplies, into the storage, at least a first liquid composed of a processing liquid or source liquids for composing the processing liquid; a detector which detects a value of a parameter indicating a state of the first liquid supplied into the storage or a state of the processing liquid in the storage; and a controller which controls the processors to perform a liquid processing in sequence. The controller determines, based on a detection result of the value of the parameter, whether it is possible to supply the processing liquid continuously into a preset number of processors concurrently under a condition requested by the processors, and, if not, the controller performs a simultaneous processing restricting control of reducing a number of processors which are supposed to perform the liquid processing concurrently to be lower than the preset number.

19 Claims, 5 Drawing Sheets

(56) References Cited

U.S. PATENT DOCUMENTS

| | | | |
|---|---|---|---|
| 2005/0027387 A1* | 2/2005 | Fujishima | H01L 21/67051 700/112 |
| 2010/0040779 A1* | 2/2010 | Nagamine | G03F 7/162 427/240 |
| 2010/0043830 A1* | 2/2010 | Kitahara | G05D 7/0664 134/18 |
| 2011/0061683 A1* | 3/2011 | Eshima | H01L 21/67017 134/18 |

* cited by examiner

SUBSTRATE PROCESSING APPARATUS AND OPERATION METHOD OF SUBSTRATE PROCESSING APPARATUS

CROSS-REFERENCE TO RELATED APPLICATION

This application claims the benefit of Japanese Patent Application No. 2018-248011 filed on Dec. 28, 2018, the entire disclosure of which are incorporated herein by reference.

TECHNICAL FIELD BACKGROUND

The various aspects and embodiments described herein pertain generally to a substrate processing apparatus and an operation method of the substrate processing apparatus.

BACKGROUND

In the manufacture of a semiconductor device, various liquid processings such as a chemical liquid cleaning processing, a plating processing and a developing processing are performed on a substrate such as a semiconductor wafer. As an apparatus configured to perform these liquid processings, there is known a substrate processing apparatus equipped with a plurality of cleaning processings units (see, for example, Patent Document 1).

In the substrate processing apparatus described in Patent Document 1, processings upon substrates are performed in sequence by using a plurality of single-wafer type cleaning processing units. In each cleaning processing unit, a chemical liquid processing, a rinsing processing and a drying processing are performed on a single sheet of substrate in sequence. A chemical liquid is supplied into the plurality of cleaning processing units from a single chemical liquid storage tank.

Patent Document 1: Japanese Patent Laid-open Publication No. 2007-123393

SUMMARY

In one exemplary embodiment, a plasma processing apparatus includes a storage configured to store a processing liquid therein; multiple processors each configured to perform a liquid processing on a substrate by using the processing liquid supplied from the storage; a liquid supply configured to supply, into the storage, at least a first liquid composed of the processing liquid or source liquids for composing the processing liquid; a detector configured to detect a value of a parameter indicating a state of the first liquid supplied from the liquid supply into the storage or a state of the processing liquid in the storage which is varied as the first liquid is supplied from the liquid supply; and a controller configured to control the multiple processors to perform the liquid processing in sequence. The controller determines, based on a detection result of the value of the parameter detected by the detector, whether it is possible to supply the processing liquid continuously into a preset number of processors at the same time from the storage under a condition requested by the processors, and, when it is not possible, the controller performs a simultaneous processing restricting control of reducing a number of processors which are supposed to perform the liquid processing at the same time with the processing liquid supplied from the storage to be lower than the preset number.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, an exemplary embodiment of a substrate processing apparatus (substrate processing system) will be described with reference to the accompanying drawings.

Figure 1:
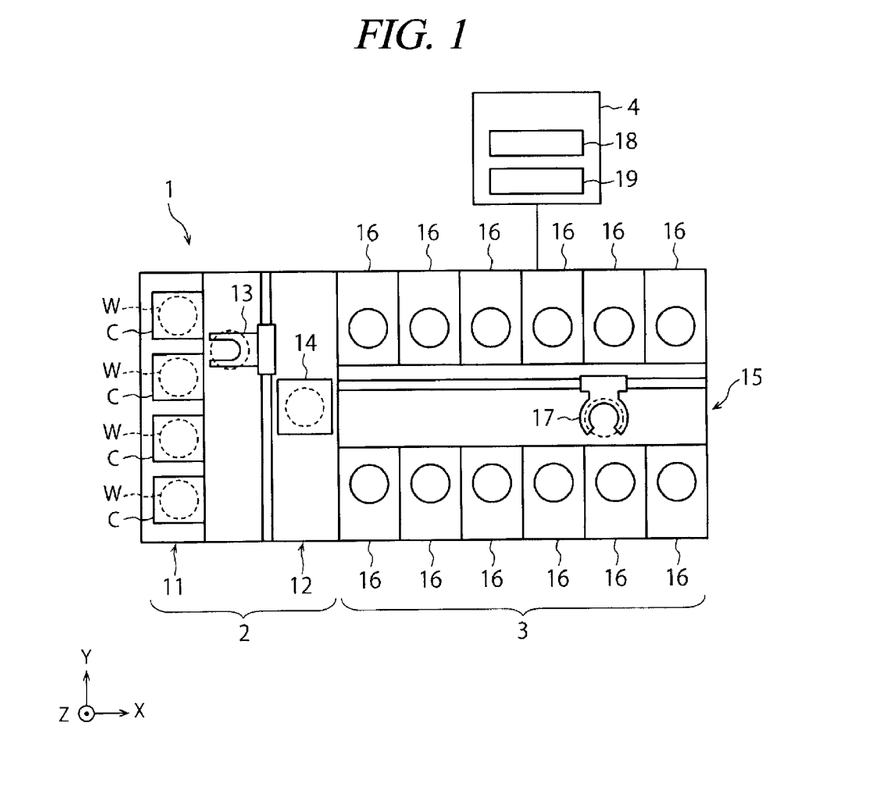
FIG. 1 is a schematic plan view illustrating an outline of a substrate processing apparatus according to an exemplary embodiment.

FIG. 1 is a plan view illustrating an outline of a substrate processing system according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and the processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units (processors) 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage 19. The storage 19 stores a program that controls various processings performed in the substrate processing system 1. The controller 18 controls the operations of the substrate processing system 1 by reading and executing the program stored in the storage 19.

Further, the program may be recorded in a computer-readable recording medium, and installed from the recording medium to the storage 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the delivery unit 14. The wafer W placed on the delivery unit 14 is taken out from the delivery unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
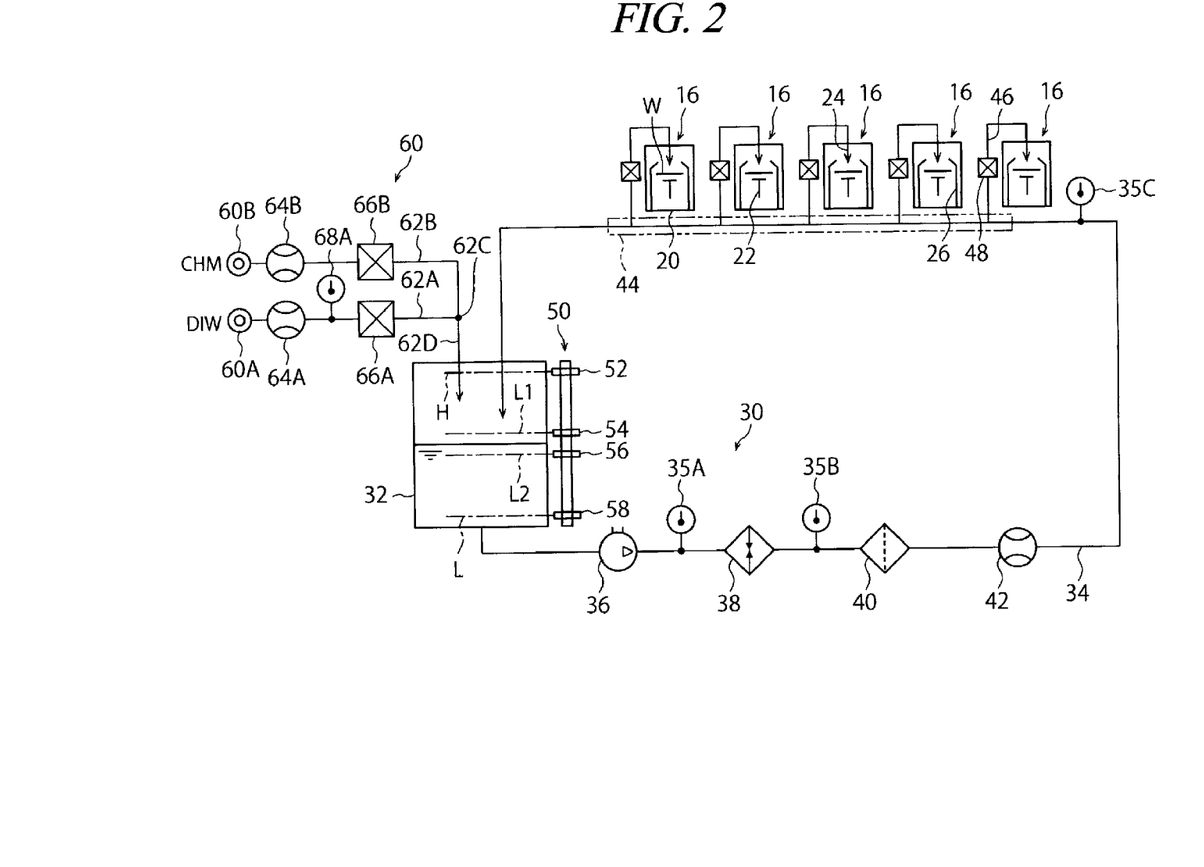
FIG. 2 is a diagram illustrating a pipeline system as an example of a chemical liquid supply system belonging to the substrate processing apparatus of FIG. 1.

A single-wafer type processing unit well-known in the relevant art may be used as the processing unit 16. As schematically illustrated in FIG. 2, the processing unit 16 includes, for example, a chamber (unit housing) 20, a spin chuck 22, one or more processing fluid nozzles 24 and a cup 26. The spin chuck 22 is configured to hold a wafer W horizontally and rotate the wafer W around a vertical axis. The one or more processing fluid nozzles 24 are configured to supply various kinds of processing fluids (for example, processing liquids such as a chemical liquid, a rinse liquid and a drying accelerating liquid, and a processing gas such as a drying gas) required to process the wafer W. The cup 26 is configured to collect the processing liquid scattered from the wafer W.

Now, referring to FIG. 2, a processing liquid supply system configured to supply the processing liquids to the processing unit 16 (a processor configured to process the substrate) will be described. The substrate processing apparatus is equipped with the same number of processing liquid supply systems as the number of the kinds of processing liquids supplied to the processing unit 16. In FIG. 2, a chemical liquid supply system 30 configured to supply a chemical liquid as the processing liquid into the processing unit 16 will be explained as an example of the processing liquid supply systems. The chemical liquid used herein may be, by way of non-limiting example, DHF (dilute hydrofluoric acid), a SC-1 solution, a SC-2 solution, or the like.

The chemical liquid supply system 30 is equipped with a tank 32 and a circulation line 34. The tank 32 is configured to store the chemical liquid therein. The circulation line 34 is provided with a pump 36, a temperature controller 38, a filter 40 and a flowmeter 42 in sequence from the upstream side.

The pump 36 is operated constantly during an operation of the substrate processing apparatus except for special cases such as when liquid replacement or maintenance of the substrate processing apparatus is performed. Accordingly, there is formed a circulation flow of the chemical liquid flown out from the tank 32 into the circulation line 34 and then returned back into the tank 32. That is, the tank 32 and the circulation line 34 constitute a circulation system.

The temperature controller 38 has a heating function and a cooling function, and is configured to maintain the chemical liquid flowing in the circulation line 34 at a preset target temperature (this target temperature is defined in a processing recipe). The temperature controller 38 may have either one of the heating function and the cooling function.

A connection area 44 is set in the circulation line 34. In the connection area 44, branch lines 46 are branched from the circulation line 34 toward the respective processing units 16. Each branch line 46 is connected to a processing fluid nozzle 24. The branch line 46 is provided with various kinds of flow rate control devices 48 such as an opening/closing valve, a flowmeter, a flow rate control valve and so forth (schematically illustrated as a single symbol).

The tank 32 is equipped with a liquid-level meter 50. The liquid-level meter 50 has a tolerance upper limit liquid-level sensor 52, a typical upper limit liquid-level sensor 54, a typical lower limit liquid-level sensor 56 and a tolerance lower limit liquid-level sensor 58. The tolerance upper limit liquid-level sensor 52 is configured to detect that a liquid level of the chemical liquid within the tank 32 exceeds a tolerance upper limit H. The tolerance lower limit liquid-level sensor 58 is configured to detect that the liquid level of the chemical liquid within the tank 32 falls below a tolerance lower limit L.

The chemical liquid supply system 30 is equipped with a liquid supply 60. The liquid supply 60 is configured to supply into the tank 32 only a composed chemical liquid (a first liquid) or a plurality of source liquids (a first liquid, a second liquid, etc.) for composing the chemical liquid. In the shown exemplary embodiment, a diluted chemical liquid (hereinafter, simply referred to as "chemical liquid"), which is prepared by diluting an undiluted liquid of the chemical liquid about 100 times with pure water (DIW) as a dilution liquid, is supplied as the chemical liquid (processing liquid)

onto the wafer W. That is, in the shown exemplary embodiment, the liquid supply 60 supplies two kinds of source liquids (a first liquid and a second liquid). The liquid supply 60 is connected to a DIW source 60A configured to supply the DIW as the first liquid among the two kinds of source liquids and an undiluted liquid source 60B configured to supply the undiluted liquid of the chemical liquid as the second liquid.

In most cases, the DIW source 60A constitutes a part of a factory power supply system installed in a semiconductor manufacturing factory in which the substrate processing apparatus is installed. That is, a flow rate and a temperature of the DIW supplied from the DIW source 60A depend on specifications and an operational status of the factory power supply system of the semiconductor manufacturing factory.

Though the undiluted liquid source 60B may also be a part of the factory power supply system installed in the semiconductor manufacturing factory in which the substrate processing apparatus is provided, it may be a non-illustrated undiluted liquid storage tank provided in the substrate processing apparatus.

The DIW source 60A is connected with a DIW supply line 62A. The DIW supply line 62A is provided with various kinds of flow rate control devices such as an opening/closing valve, a flowmeter 64A, and a flow rate control valve. The various kinds of flow rate control devices except for the flowmeter 64A are schematically illustrated as a single symbol which is assigned a reference numeral 66A. The DIW supply line 62A is also provided with a temperature sensor 68A configured to measure a temperature of the DIW flowing in the DIW supply line 62A.

The undiluted liquid source 60B is connected with an undiluted liquid supply line 62B. The undiluted liquid supply line 62B is provided with various kinds of flow rate control devices such as an opening/closing valve, a flowmeter 64B, and a flow rate control valve. The various kinds of flow rate control devices except for the flowmeter 64B are schematically illustrated as a single symbol which is assigned a reference numeral 66B.

The DIW supply line 62A and the undiluted liquid supply line 62B join at a junction point 62C and are merged into a single chemical liquid supply line 62D. The chemical liquid supply line 62D ends within the tank 32. To accelerate the mixing of the DIW and the source liquid, a non-illustrated in-line mixer may be provided at the chemical liquid supply line 62D.

Further, in composing the chemical liquid (diluted chemical liquid), two or more kinds of undiluted liquids (a second liquid, a third liquid, etc.) may be mixed with DIW (a first liquid) as a dilution liquid. In this case, the undiluted liquid supply lines 62B are provided, and the number of these undiluted liquid supply lines 62B is set to be the same as the number of the kinds of the undiluted liquids. These undiluted liquid supply lines 62B are connected to the single DIW supply line 62A. To elaborate, in case that the chemical liquid is, by way of non-limiting example, a SC-2 solution, the undiluted liquids are hydrochloric acid and hydrogen peroxide water, and there are provided two undiluted liquid supply lines 62B, that is, a hydrochloric acid supply line and a hydrogen peroxide water supply line.

In the present specification, the term "undiluted liquid" implies a liquid to be mixed with another source liquid (in the shown exemplary embodiment, DIW as the dilution liquid), and is not limited to a commercially used chemical liquid having the highest concentration. To elaborate, low-concentration DHF already diluted with DIW may be supplied from the undiluted liquid source 60B as the "undiluted liquid", and ultra-low-concentration DHF prepared by diluting this low-concentration DHF with the DIW from the DIW source 60A may be supplied into the tank 32 as the "chemical liquid (diluted chemical liquid)".

Now, operations of the substrate processing apparatus will be described. All the operations to be described below are performed under the control of the control device 4 (controller) shown in FIG. 1.

The substrate processing apparatus is equipped with the plurality of, e.g., twelve processing units 16. The substrate transfer device 17 of the transfer section 15 takes out wafers W temporarily placed on the delivery unit 14 in sequence according to a preset transfer schedule and transfers the taken wafers W into the plurality of processing units 16 in sequence (see FIG. 1). In each processing unit 16, various kinds of processes (in the present exemplary embodiment, a chemical liquid cleaning process, a rinsing process and a drying process) are performed on a single sheet of wafer W in sequence according to a preset processing recipe.

In the chemical liquid cleaning process, the wafer W horizontally held by the spin chuck 22 is rotated around the vertical axis at a predetermined rotational speed. In this state, the chemical liquid (diluted chemical liquid) is sent from the circulation line 34 of the chemical liquid supply system 30 into the processing fluid nozzle 24 via the branch line 46 corresponding to the processing unit 16 and the flow rate control devices 48 provided at that branch line 46. Then, the chemical liquid is supplied onto the wafer W from the processing fluid nozzle 24.

In the rinsing process, while rotating the wafer W, a rinse liquid, for example, pure water (DIW) is sent from a non-illustrated rinse liquid supply system into the same processing fluid nozzle as used in the chemical liquid cleaning process or another processing fluid nozzle 24. Then, the rinse liquid is supplied onto the wafer W from this processing fluid nozzle 24.

In the drying process, while rotating the wafer W, the supply of the rinse liquid is stopped, and scattering/drying of the wafer W is performed. Here, it may be possible to perform the drying process after replacing the rinse liquid on the wafer W with an organic solvent such as IPA having high volatility and low surface tension after the rinsing process.

To efficiently operate the substrate processing apparatus having the plurality of (for example, twelve (only five are illustrated in FIG. 2)) processing units 16, timings for carry-in of the wafers W into the respective processing units 16 are delayed by a preset time. Accordingly, the number of the processing units 16 into which the chemical liquid needs to be supplied at the same time can be reduced, and a supply capacity of the chemical liquid supply system 30 need not be set to be high excessively. Further, a load on the substrate transfer device 17 is reduced.

Since a preset amount of the chemical liquid is consumed by the processing unit 16 whenever the processing unit 16 processes a single sheet of wafer W, the amount of the chemical liquid existing within the tank 32 decreases gradually with a lapse of time. If it is detected by the typical lower limit liquid-level sensor 56 that the liquid level of the chemical liquid within the tank 32 is less than the typical lower limit liquid level L2, the liquid supply 60 replenishes the chemical liquid (undiluted liquid+dilution liquid) into the tank 32 via the chemical liquid supply line 62D.

The liquid supply 60 supplies the undiluted liquid and the DIW (dilution liquid) at a preset flow rate ratio by the flow rate control devices 64A, 66A, 64B and 66B such that the chemical liquid of a predetermined concentration (mixing ratio) is supplied into the tank 32. Accordingly, the concentration of the chemical liquid (diluted chemical liquid) certainly reaches a required concentration at a time point when this chemical liquid is introduced into the tank 32. The flow rate ratio of the undiluted liquid supplied through the undiluted liquid supply line 62B and the DIW supplied through the DIW supply line 62A may not need to be maintained at the preset flow rate ratio constantly during the replenishment of the chemical liquid by the liquid supply 60, but a certain degree of variation thereof is allowed.

A replenishment rate of the chemical liquid by the liquid supply 60 (an amount of the chemical liquid supplied into the tank 32 from the liquid supply 60 per unit time) is set to be larger than a consumption rate of the chemical liquid by the plurality of processing units 16 (a total amount of the chemical liquid consumed by the plurality of processing units 16 per unit time). Accordingly, the liquid level of the chemical liquid within the tank 32 increases gradually. A schedule for the carry-in of the wafers W into the plurality of processing units 16 (that is, a processing schedule of the plurality of processing units 16) need not be changed between a time period during which the replenishment of the chemical liquid by the liquid supply 60 is performed and a time period during which it is not.

If it is detected by the typical upper limit liquid-level sensor 54 that the liquid level of the chemical liquid within the tank 32 has reached the typical upper limit liquid level L1, the liquid supply 60 of the chemical liquid supply system 30 stops the replenishment of the chemical liquid (undiluted liquid+dilution liquid) into the tank 32.

The above-described operations of the substrate processing apparatus are performed when the substrate processing apparatus and the factory power supply system are operated as intended. However, there may be assumed a case when a power supply requested by the substrate processing apparatus cannot be carried out due to a problem in the factory power supply system, or a case when a supply capacity of the factory power supply system is temporally insufficient due to a temporary increase by the request of the substrate processing apparatus. In the following, how to cope with these cases (an operation method of the substrate processing apparatus) will be discussed.

First Exemplary Embodiment

Figure 3:
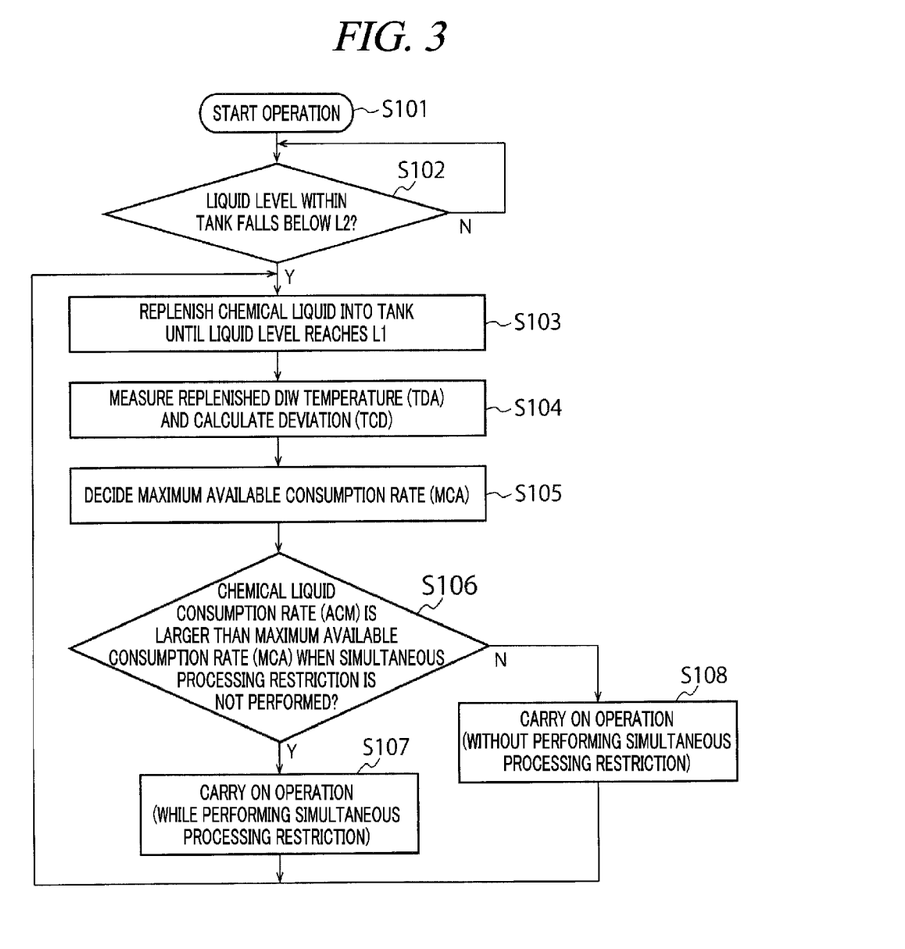
FIG. 3 is a flowchart for describing an operation method of the substrate processing apparatus according to a first exemplary embodiment.

Below, the operation method according to a first exemplary embodiment will be explained with reference to a flowchart of FIG. 3 and a time chart of FIG. 4. The operation method according to the first exemplary embodiment relates to coping with a variation of a temperature of the DIW supplied from the DIW source 60A.

In the description of the first exemplary embodiment, the following situation is assumed. That is, assume that the factory power supply system has a problem and an actual temperature of the DIW supplied from the DIW source 60A is higher than a target temperature. In the first exemplary embodiment, the mixing ratio of the undiluted liquid and the DIW is, for example, about 1:100 (a dilution ratio of about 100 times), and a temperature of the chemical liquid (diluted chemical liquid) relies on a temperature of the DIW supplied from the DIW source 60A. If the actual temperature of the DIW is higher than the target temperature, the temperature of the chemical liquid supplied into the tank 32 from the liquid supply 60 becomes higher than a target temperature (set temperature). If the chemical liquid having the temperature higher than the target temperature is supplied into the tank 32, a temperature of the chemical liquid flown out from the tank 32 into the circulation line 34 is also increased.

Further, the following description is based on a premise that the temperature of the chemical liquid supplied into the processing unit 16 does not fall out of a tolerance range immediately because the amount of the chemical liquid existing within the circulation system is several times larger than the replenishment amount of the diluted chemical liquid in a single-cycle replenishment (a replenishment whereby the liquid level is increased from L2 to L1). Further, the following description is also based on a premise that the actual temperature of the DIW supplied from the DIW source 60A may not vary greatly enough to immediately cause the temperature of the chemical liquid supplied into the processing unit 16 to be out of the tolerance range. In a situation where such a rapid temperature variation occurs, the substrate processing apparatus generally sets forth an alarm and stops all the processings by the plurality of processing units.

If it is detected by the temperature sensor 35A (or 35B or 35C) provided at the circulation line 34 that the temperature of the chemical liquid flown out from the tank 32 into the circulation line 34 is increased, the temperature controller 38 performs a feedback control of cooling the chemical liquid passing through the temperature controller 38 to thereby allow the temperature of the chemical liquid to approach the target temperature.

Further, if the actual temperature of the DIW supplied from the DIW source 60A is lower than the target temperature, the temperature controller 38 performs a feedback control of heating the chemical liquid passing through the temperature controller 38 to thereby allow the temperature of the chemical liquid to approach the target temperature.

If a deviation of the actual temperature of the DIW supplied from the DIW source 60A from the target temperature is relatively small, the temperature variation is absorbed through a temperature control function of the temperature controller 38, and a transfer (processing) schedule need not be changed.

If the deviation of the actual temperature of the DIW supplied from the DIW source 60A from the target temperature thereof is increased, the temperature variation may not be absorbed through the temperature control function of the temperature controller 38. That is, if the chemical liquid is continuously supplied into the tank 32 from the liquid supply 60 with the same frequency as that in case where the deviation is small, the temperature of the chemical liquid within the circulation system gradually increases (or decreases) and finally fall out of the tolerance temperature range. If the wafer W is processed by the chemical liquid which is out of the tolerance temperature range, a defect in the processing may be caused.

Below, an example of solutions of the above-stated problem will be explained.

To facilitate the understanding of the following description, an example of operation conditions for the substrate processing apparatus according to the present exemplary embodiment will be first stated.

The chemical liquid within the tank 32 is 60 liters when the liquid level is L1.

The chemical liquid needed to increase the liquid level within the tank 32 from L2 to L1 is 20 liters.

When a single processing unit 16 processes a single sheet of wafer W, the chemical liquid is supplied to the wafer W at a flow rate of 2 L/min.

In a typical operation mode, five processing units supply the diluted chemical liquid onto wafers W at the same time (however, timings for the start of the supply are different from each other).

As can be seen from the above, the replenishment of the chemical liquid for increasing the liquid level within the tank 32 from L2 to L1 is performed with a relatively high frequency, for example, with a frequency of once per several minutes, and the replenishment amount of the chemical liquid in a single cycle is equivalent to 10% of a total amount of the chemical liquid that has existed within the tank 32 before the replenishment. Furthermore, it should be understood that the above-stated conditions may differ depending on a specification of an individual processing apparatus and a processing to be performed, so that the above-stated conditions are nothing more than an example.

Figure 4:
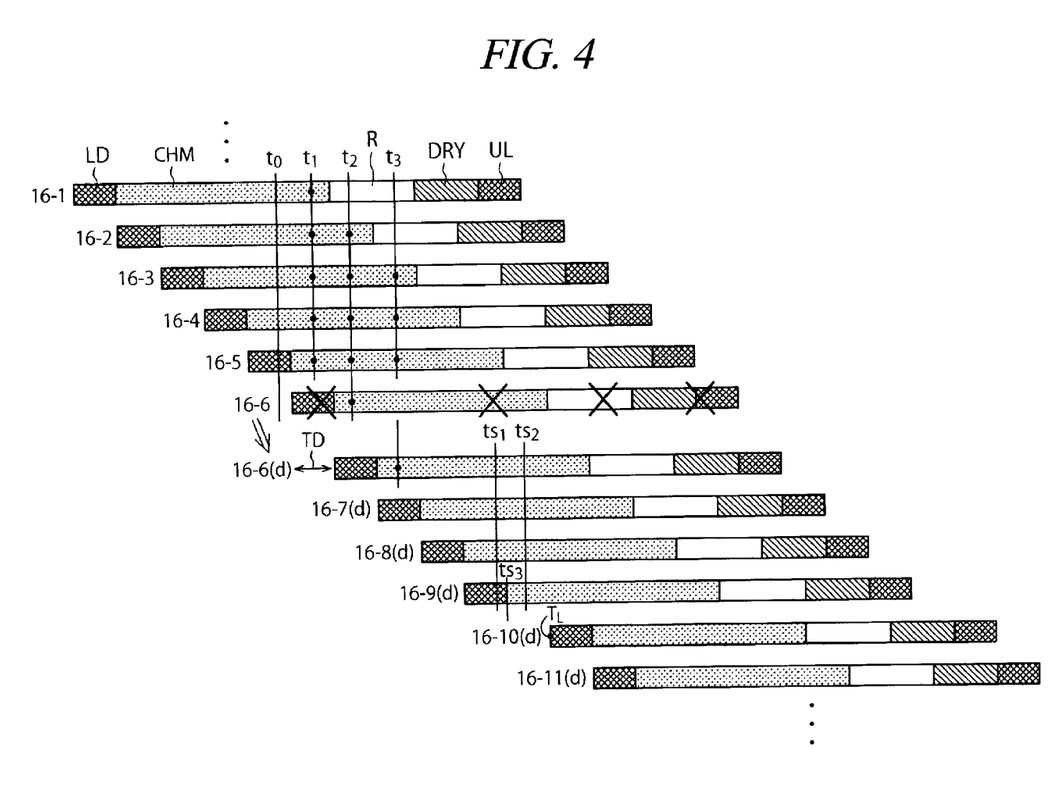
FIG. 4 is a time chart for describing the operation method of the substrate processing apparatus according to the first exemplary embodiment.

If an operation of the substrate processing apparatus is begun (process S101 of FIG. 3), the substrate processing apparatus performs processings on the wafers W by the plurality of processing units 16 while delaying the timings for carry-in of the wafers W into the individual processing units 16 by a preset time (see FIG. 4).

An initial liquid level within the tank 32 is L1. Since the chemical liquid is not replenished into the tank 32 from the liquid supply 60 for a while after the operation of the substrate processing apparatus is begun, the liquid level within the tank 32 decreases gradually. The control device 4 keeps on monitoring a state of the typical lower limit liquid-level sensor 56.

If it is detected by the typical lower limit liquid-level sensor 56 that the liquid level within the tank 32 falls below L2 (YES in process S102), the chemical liquid is supplied (replenished) into the tank 32 from the liquid supply 60 until it is detected by the typical upper limit liquid-level sensor 54 that the liquid level within the tank 32 has reached L1 (process S103).

While the chemical liquid is being supplied into the tank 32 from the liquid supply 60 (hereinafter, referred to as "chemical liquid replenishment period"), the control device 4 keeps on measuring the temperature of the DIW passing through the DIW supply line 62A by using the temperature sensor 68A provided at the DIW supply line 62A. Then, the control device 4 calculates an average of detection values (detected temperatures) of the temperature sensor 68A within the chemical liquid replenishment period. This average is referred to as "replenished DIW temperature (TDA)". A detection value (representative value) of the temperature sensor 68A at a single time point within the chemical liquid replenishment period or an average of detection values of the temperature sensor 68A at several time points within the chemical liquid replenishment period may be regarded as "replenished DIW temperature (TDA)". Furthermore, this replenished DIW temperature (TDA) corresponds to a parameter indicating a state of the first liquid (DIW) supplied from the liquid supply 60 into the tank 32 (storage).

Instead of measuring the replenished DIW temperature within the chemical liquid replenishment period, a temperature of the chemical liquid flowing in the chemical liquid supply line 62D toward the tank 32 may be measured by a non-illustrated temperature sensor.

Moreover, in addition to measuring the replenished DIW temperature within the chemical liquid replenishment period, a temperature of the undiluted liquid passing through the undiluted liquid supply line 62B may be measured. In the present exemplary embodiment, however, since the dilution ratio is high as stated above (for example, undiluted liquid: DIW=1:100), only the replenished DIW temperature is measured on the basis of the belief that it will be enough to measure only the replenished DIW temperature. Since the sensor for measuring the DIW temperature is not required to have chemical resistance, an advantage of low cost can be achieved.

Based on the aforementioned replenished DIW temperature (TDA), it is possible to calculate an average temperature (TCA) of the chemical liquid supplied into the tank 32 within the chemical liquid replenishment period (a temperature of the chemical liquid when the chemical liquid supplied in the chemical liquid replenishment period is completely mixed (homogenized)). Since the dilution ratio is high as stated above, the replenished DIW temperature (TDA) may be regarded as the (actual) average temperature (TCA) of the chemical liquid.

Subsequently, a deviation (TCD=TCA−TCT) of the (actual) average temperature (TCA) of the chemical liquid (which can be replaced by an actual value of the replenished DIW temperature (TDA)) from a target temperature (TCT) of the chemical liquid (which can be replaced by a target value of the replenished DIW temperature) is calculated (process S104).

Since a temperature control ability of the temperature controller 38 is already known, a tolerance limit of the frequency for replenishing the chemical liquid into the tank 32 from the liquid supply 60 of the chemical liquid supply system 30 can be calculated based on the deviation (TCD=TCA−TCT). Further, in the present exemplary embodiment, it needs to be noted one more time that the amount of the chemical liquid supplied through a single cycle of the replenishment (the amount required to increase the liquid level within the tank 32 to L1 from L2) is constant.

In case that an absolute value of the deviation (TCD) is increased not to be suitable for the temperature control ability of the temperature controller 38, the actual temperature of the chemical liquid existing in the circulation system (tank 32+circulation line 34) is deviated from the target temperature if the replenishment of the chemical liquid is performed with the same frequency as that in case when the absolute value of the deviation (TCD) is small. If the actual temperature of the chemical liquid within the circulation system falls out of the tolerance range, a defect in a chemical liquid processing performed in the processing unit 16 may be caused.

To suppress this problem, in the present exemplary embodiment, the frequency for the replenishment of the chemical liquid is reduced based on the deviation (TCD=TCA−TCT), thus suppressing the increase of the deviation of the actual temperature of the chemical liquid from the target temperature at least, and, desirably, reducing the deviation.

In case that the frequency for the replenishment of the chemical liquid is reduced, it is difficult to maintain the liquid level of the chemical liquid within the tank 32 equal to or higher than L2 if the (multiple) processing units 16 consume the chemical liquid at the same pace as in case when the frequency for the replenishment of the chemical liquid is not reduced. That is, finally, it becomes impossible to carry on the liquid processings in the processing units 16. It is desirable that a variation range of a state (a total amount, a temperature, etc.) of the chemical liquid within the circulation system (tank 32+circulation line 34) is maintained small. That is, an excessive decrease (below L2) of the liquid level of the chemical liquid within the tank 32 as stated above is not desirable.

In the present exemplary embodiment, the processings upon the wafers W in the processing units 16 are restricted based on the deviation (TCD=TCA−TCT), and a chemical liquid consumption rate (a total amount (L/min) of the chemical liquid consumed by the plurality of processing units 16 per unit time) is reduced. To elaborate, by reducing the number of the processing units 16 which are supplying the chemical liquid onto the wafer W at the same time (for example, by reducing this number of the processing units 16 from five to four), the chemical liquid consumption rate is reduced. This control is referred to as "simultaneous processing restriction (simultaneous processing restricting control)".

Now, a specific sequence of the simultaneous processing restricting control in the first exemplary embodiment will be explained. In this control, a deviation (TDD) between the replenished DIW temperature (TDA) and a target DIW temperature (TDT) as a target value thereof, which is regarded as being equivalent to the deviation (TCD), will be used instead of the deviation (TCD).

The control device 4 stores therein the following table (Table 1) showing a relationship between the aforementioned deviation (TDD) and a maximum available consumption rate (MCA). Here, the term "the maximum available consumption rate (MCA)" refers to a maximum value of the chemical liquid consumption rate (L/min) by the (plurality of) processing units 16 which do not cause the problem in the processing of the wafers W in the (plurality of) processing units 16. Here, "not causing the problem in the processing of the wafers W" implies that the chemical liquid having a temperature within a tolerance range is supplied to the wafer W in each processing unit 16 at an expected flow rate (a flow rate within the tolerance range) at any time point. The maximum available consumption rate (MCA) is calculated on the assumption that the DIW having a preset deviation (TDD) is continuously supplied from the DIW source 60A for a certain time period (for a time period during which the replenishment of the chemical liquid into the tank 32 is performed at least several times). Further, the maximum available consumption rate (MCA) specified in the following table are temporary values set for the convenience of explanation, and these values may not be used in operating the substrate processing apparatus actually.

TABLE 1

| Deviation (TDD) | Maximum available consumption rate(MCA) |
|---|---|
| +1.5° C. < TDD ≤ +2.0° C. | 8 L/min |
| +1.0° C. < TDD ≤ +1.5° C. | 10 L/min |
| +0.5° C. < TDD ≤ +1.0° C. | 15 L/min |
| 0.0° C. < TDD ≤ +0.5° C. | 30 L/min |
| −0.5° C. < TDD ≤ 0.0° C. | 30 L/min |
| −1.0° C. < TDD ≤ −0.5° C. | 30 L/min |
| −1.5° C. < TDD ≤ −1.0° C. | 15 L/min |
| −2.0° C. < TDD ≤ −1.5° C. | 10 L/min |

Further, in Table 1, when the deviation (TDD) is in the range from +1.5° C. to +2.0° C., the maximum available consumption rate (MCA) is 8 L/min, whereas when the deviation (TDD) is in the range from −1.5° C. to −2.0° C., the maximum available consumption rate (MCA) is 10 L/min. This difference in the maximum available consumption rates (MCA) for the deviations (TDD) having the same absolute values is caused by the fact that heating ability of the temperature controller 38 used in the present exemplary embodiment is higher than cooling ability thereof. Accordingly, if the configuration of the temperature controller 38 is changed or if a difference between a target temperature of the processing liquid and an environment temperature (for example, a room temperature) is changed, the aforementioned maximum available consumption rate (MCA) is changed.

If a single time of the replenishment of the chemical liquid is finished and the replenished DIW temperature (TDA) and the aforementioned deviation (TDD) are calculated (process S104), the control device 4 calculates the maximum available consumption rate (MCA) by referring to Table 1 (process S105). Here, assuming that the deviation (TDD) is in the range from +1.5° C. to +2.0° C., the maximum available consumption rate (MCA) corresponding thereto is 8 L/min.

Subsequently, the control device 4 compares the calculated maximum available consumption rate (MCA) with a chemical liquid consumption rate (ACM) (sum of the supply rates of the chemical liquid in the plurality of processing units 16 per unit time) which is being consumed by the plurality of processing units 16 under a processing schedule (transfer schedule) in which the simultaneous processing restricting control is not performed. In the example shown in the time chart of FIG. 4, since the five processing units 16 always perform the chemical liquid cleaning process at the same time (that is, five processing units 16 supply the diluted chemical liquid onto the wafers W at the same time), the substrate processing apparatus consumes the chemical liquid at the chemical liquid consumption rate of 10 L/min (as the supply rate of the chemical liquid onto the wafer W in the single processing unit 16 is 2 L/min).

Further, depending on the processing schedule, there may be an occasion when the five processing units 16 perform the chemical liquid cleaning process simultaneously at a certain time point and only four processing units 16 perform the chemical liquid cleaning process simultaneously at another time point. In such a case, it is desirable to compare the maximum value of the chemical liquid consumption rate with the maximum available consumption rate (MCA).

As stated above, if the maximum available consumption rate (MCA) is 8 L/min and the chemical liquid consumption rate when the simultaneous processing restricting control is not performed is 10 L/m which is larger than the maximum available consumption rate (MCA), the control device 4 makes a determination that the chemical liquid consumption rate (ACM) when the simultaneous processing restricting control is not performed is larger than the maximum available consumption rate (MCA) (YES in process S106).

Then, the control device 4 calculates the number of the processing units 16 which perform the chemical liquid cleaning process at the same time and in which the chemical liquid consumption rate (ACM) becomes equal to or less than the maximum available consumption rate (MCA). In the above example, the number of the processing units 16 which perform the chemical liquid cleaning process at the same time needs to be reduced from five to four.

The control device 4 carries on the operation of the substrate processing apparatus while maintaining the number of the processing units 16 which perform the chemical liquid cleaning process at the same time to be equal to or less than the calculated number (desirably, equal to the calculated number) (process S107). If the determination result of the process S106 is NO, the control device 4 does not perform the simultaneous processing restricting control and carries on the operation of the substrate processing apparatus (process S108).

Generally, the temperature of the DIW supplied from the DIW source 60A as a part of the factory power supply system does not vary sharply in a short time. Thus, if the simultaneous processing restricting control is begun, the operation of the substrate processing apparatus is generally carried on while restricting the number of the processing units 16 which perform the chemical liquid cleaning process at the same time to four. Thereafter, if the deviation (TDD) is reduced, the number of the processing units 16 which perform the chemical liquid cleaning process at the same time is increased or returned back to the original number.

A specific operation example of the flow from the process S104 to the process S108 will be described in further detail. On the time chart of FIG. 4, movement from the left side to the right side implies a lapse of time. On the time chart of FIG. 4, numbers assigned to the number 16 along with hyphens are for distinguishing the individual processing units, and "(d)" indicates that it is after a carry-in delay to be described later is performed.

Further, on the time chart of FIG. 4, "LD" refers to a period (carry-in period) during which the substrate transfer device 17 takes out a wafer W before being processed from the delivery unit 14 and then carries the wafer W into the processing unit 16. "CHM" refers to a period (chemical liquid cleaning process period) during which the chemical liquid is being supplied onto the wafer W in the processing unit 16. "R" denotes a period (rinsing process period) during which a rinse liquid (DIW) is being supplied onto the wafer W within the processing unit 16. "DRY" refers to a period (drying process period) during which the scattering/drying of the wafer W is performed within the processing unit 16 (no processing liquid is supplied onto the wafer W). Further, "UL" denotes a period (carry-out period) during which the substrate transfer device 17 takes out the wafer W after being processed from the processing unit 16 and then carries the wafer W after being processed into the delivery unit 14.

(1) It is assumed that, at a time point t0 on the time chart of FIG. 4, the replenishment of the chemical liquid into the tank 32 is finished and the control device 4 completes the measurement and the calculation of the process S104 and the process S105. Here, it is assumed that the maximum available consumption rate (MCA) calculated by the control device 4 is 8 L/min as stated above.

(2) Then, among the processing units 16 set to be in the chemical liquid cleaning process period (CHM) (that is, among the plurality of processing units 16 which are supplying the chemical liquid to the wafers W) at the current time point t0, a processing unit 16 (here, a processing unit 16-1 on the time chart of FIG. 4) supposed to end the chemical liquid cleaning process period (CHM) earliest is specified.

(3) Subsequently, among the processing units 16 which are not provided with the wafers W at the current time point t0, a processing unit 16 (here, a processing unit 16-6 on the time chart of FIG. 4) supposed to be loaded with the wafer W earliest is specified.

(4) The control device 4 determines whether there is a time point when the chemical liquid consumption rate (ACM) is larger than the maximum available consumption rate (MCA) in case that the specified processing unit 16-6 and processing units 16-7, 16-8, 16-9, 16-10, etc. supposed to be loaded with the wafers W in sequence are operated according to a preset processing schedule (corresponding to process S106).

In the example of FIG. 4, since the five processing units 16 perform the chemical liquid cleaning process at the same time at a time point t2, for example, the chemical liquid consumption rate (ACM) of the substrate processing apparatus at the time point t2 is 2×5=10 (L/min). Accordingly, the control device 4 makes a determination that there exists the time point when the chemical liquid consumption rate (ACM) becomes larger than the maximum available consumption rate (MCA).

(5) When the control device 4 makes such a determination (corresponding to YES in process S106), the control device 4 changes the processing schedule of each processing unit 16 such that the number of the processing units 16 which perform the chemical liquid cleaning process at the same time to be equal to or less than four (desirably, four).

To elaborate, the control device 4 delays a carry-in timing for the processing unit 16-6, which is a processing unit which is not set to be in the carry-in period LD at the current time point t0 and for which the carry-in period LD arrives earliest, by a preset delay time TD (refer to 16-6(*d*)). The delay time TD is set such that the number of the processing units 16 that are supplying the chemical liquid at the same time becomes equal to or less than four even at a time point t3 when the chemical liquid cleaning process is being performed in the processing unit 16-6. In the example shown in FIG. 4, the delay time TD is set such that the chemical liquid cleaning process period CHM in the processing unit 16-6 is begun at the same time when or after the chemical liquid cleaning process period CHM in the processing unit 16-1 is ended.

Likewise, carry-in timings for the processing units 16-7, 16-8, 16-9, 16-10, etc. are also delayed such that the number of the processing units 16 which perform the chemical liquid cleaning process at the same time becomes equal to or less than four (desirably, four). In FIG. 4, "(d)" is assigned to the number of the processing unit for which the carry-in timing is delayed.

A preset carry-in timing is overwritten with the delayed carry-in timing, and, then, this overwritten carry-in timing is regarded as the preset carry-in timing.

Meanwhile, if the control device 4 makes a determination that there exist no time point when the chemical liquid consumption rate (ACM) exceeds the maximum available consumption rate (MCA) (corresponding to NO in the process S106), the carry-in timings for the wafers W into the processing units 16-6, 16-7, 16-8, 16-9, 16-10, etc. are maintained, and processings in these processing units 16 are performed as scheduled.

(6) Thereafter, every time when the replenishment of the chemical liquid into the tank 32 is completed, the sequences (2) to (5) are repeated. If the deviation (TDD) is changed, the sequences (2) to (5) are performed based on the maximum available consumption rate (MCA) according to the deviation (TDD).

In the example shown in FIG. 4, the five processing units 16 consume the chemical liquid at the same time at a time point t1 after the time point t0. Further, at the time point t0, the chemical liquid cleaning process for the wafer W is not begun in the processing unit 16-5, though the carry-in of the wafer W is completed. Accordingly, by delaying the beginning of the chemical liquid cleaning process on the wafer W in the processing unit 16-5, it is also possible to limit the chemical liquid consumption rate (ACM) to be equal to or less than the maximum available consumption rate (MCA). Since, however, the degree of cleanness within the processing unit 16 is lower than that within the delivery unit 14, it is desirable to use the delivery unit 14 as a place where the wafer W stays. Thus, in the present exemplary embodiment, the carry-in timing for the wafer W into the processing unit 16 into which the wafer W taken out from the delivery unit 14 subsequently is supposed to be carried-in (processing schedule of the corresponding wafer W) is delayed. Further, by returning the wafer W after being taken out of the delivery unit 14 and before being carried into the processing unit 16 back to the delivery unit 14, it is also possible to limit the chemical liquid consumption rate (ACM) to be equal to or less than the maximum available consumption rate (MCA). However, this manual correction of the transfer schedule is complicated. For this reason as well, in the present exemplary embodiment, the carry-in timing for the wafer W into the processing unit 16 into which the wafer W taken out of the delivery unit 14 subsequently is supposed to be carried in (processing schedule of the corresponding wafer W) is delayed. In this way as well, since there is little time when the chemical liquid consumption rate (ACM) exceeds the maximum available consumption rate (MCA), there is caused no problem in the operation of the substrate processing apparatus.

Assume that the replenishment of the chemical liquid into the tank 32 is performed at a certain time ts (not shown) when the simultaneous processing restricting control is performed and the maximum available consumption rate (MCA) is newly calculated. Also, assume that the number of the processing units 16 capable of performing the chemical liquid cleaning process at the same time, which is calculated based on the newly obtained maximum available consumption rate (MCA), becomes larger than the number of the processing units 16 which are performing the chemical liquid cleaning process at the same time at the current time point ts. In this case, it is desirable, from the viewpoint of improving a throughput of the substrate processing apparatus, to carry a wafer W immediately into the processing unit 16 which is supposed to reach the carry-in period LD in the earliest time among the processing units 16 which are not loaded with the wafers W at the current time point ts.

To elaborate, assume that the maximum available consumption rate (MCA) is newly calculated at a time point ts1 on the time chart of FIG. 4, for example. Also, assume that the number (five) of the processing units 16 capable of performing the chemical liquid cleaning process at the same time, which is calculated based on the newly calculated maximum available consumption rate (MCA), becomes larger than the number (four) of the processing units 16 which are performing the chemical liquid cleaning process at the same time at the current time point ts1. In this case, since the substrate transfer device 17 can be used at a time point ts3, it is desirable to set a starting time point TL for a carry-in of the wafer W into a processing unit 16-10(*d*), which is supposed to be loaded with the wafer W subsequently, to be moved up to the time point ts3.

Further, assume that the maximum available consumption rate (MCA) is newly calculated at a time point ts2 on the time chart of FIG. 4, for example. Also, assume that the number (five) of the processing units 16 capable of performing the chemical liquid cleaning process at the same time, which is calculated based on the newly calculated maximum available consumption rate (MCA), becomes larger than the number (four) of the processing units 16 which are performing the chemical liquid cleaning process at the same time at the current time point ts2. In this case, since the substrate transfer device 17 can be used at the current time point ts2, it is desirable to immediately start the carry-in of the wafer W into the processing unit 16-10(*d*) supposed to be loaded with the wafer W subsequently (specifically, take-out of the wafer W from the delivery unit 14). That is, the starting time point TL of the carry-in period LD for the wafer W is moved up to the time point ts2.

Second Exemplary Embodiment

Figure 5:
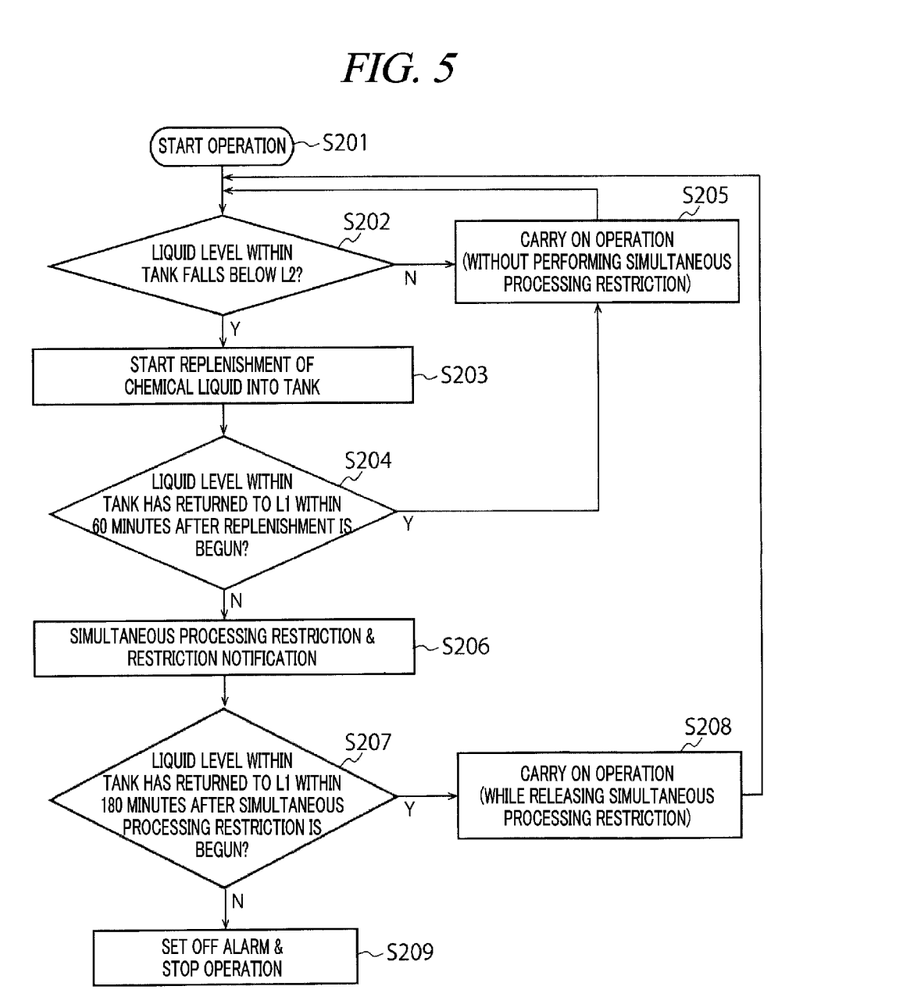
FIG. 5 is a flowchart for describing an operation method of the substrate processing apparatus according to a second exemplary embodiment.

Now, an operation method according to a second exemplary embodiment will be explained with reference to a flowchart of FIG. 5. The operation method according to the second exemplary embodiment is directed to coping with a situation in which the liquid supply 60 is not capable of supplying a chemical liquid (processing liquid) to satisfy a supply rate of the chemical liquid requested by (the plurality of) processing units 16. For example, this situation may be caused due to a temporary decrease of a supply rate (flow rate) of DIW that can be supplied from the DIW source 60A of the factory power supply system. Further, by way of another example, this situation may be caused because a processing accompanying consumption of a large quantity of the chemical liquid is temporality performed on wafers W of a single lot or a plurality of lots in the substrate processing apparatus.

Further, in the following description, only a relationship between the supply rate of the chemical liquid requested by the processing units 16 and a supply rate of the chemical liquid which can be supplied by the liquid supply 60 will be considered, without considering other factors such as a variation of a temperature of the DIW supplied from the DIW source 60A, which has been considered in the above-described first exemplary embodiment. Further, it is assumed that if the flow rate of the DIW supplied from the DIW source 60A decreases, a supply amount of the chemical liquid from the undiluted liquid source 60B is also decreased to thereby allow a mixing ratio between the DIW and the chemical liquid to be maintained at an appropriate value.

Upon the beginning of the operation of the substrate processing apparatus, the substrate processing apparatus performs the processing upon wafers W by the processing units 16, while delaying a carry-in timing for the wafers W into the processing unit 16 by a predetermined time (process S201). In the second exemplary embodiment, it is assumed that five processing units are supplying the chemical liquid upon the wafers W at the same time, as in the first exemplary embodiment.

As in the first exemplary embodiment, if it is detected by the typical lower limit liquid-level sensor 56 that the liquid level of the chemical liquid within the tank 32 is less than the typical lower limit liquid level L2 (YES in process S202), the liquid supply 60 starts the replenishment of the chemical liquid (undiluted liquid+dilution liquid) into the tank 32 (process S203). Further, the liquid level of the chemical liquid within the tank 32 detected by the liquid-level meter 50 corresponds to a parameter indicating a state of the chemical liquid within the tank 32 (storage) which varies as the first liquid (DIW or diluted chemical liquid) is supplied from the liquid supply 60.

The control device 4 measures an elapsed time from the beginning of replenishment of the chemical liquid by using a timer function of the control device 4, while monitoring a state of the typical upper limit liquid-level sensor 54. If it is detected by the typical upper limit liquid-level sensor 54 that the liquid level within the tank 32 exceeds the typical upper limit liquid level L1 and if the elapsed time at the moment is equal to or less than a predetermined first reference time (e.g., 60 minutes) (YES in process S204), the substrate processing apparatus carries on the processing without changing the carry-in timing (processing schedule), that is, without performing the simultaneous processing restricting control (process S205).

If the liquid level within the tank 32 does not reach the typical upper limit liquid level L1 after a lapse of 60 minutes from the beginning of the replenishment of the chemical liquid (NO in the process S204), the control device 4 performs the simultaneous processing restricting control in the same way as in the first exemplary embodiment (process S206). Further, by using a non-illustrated user interface, the control device 4 notifies an operator of the substrate processing apparatus of the fact that the simultaneous processing restricting control is being performed.

A timing for starting the carry-in delay of the wafer W through the simultaneous processing restricting control may be set to be the same as that of the first exemplary embodiment. That is, at a time point when the determination of "NO" is made in the process S204, the processing schedule for carry-in into the processing unit 16, supposed to process a wafer W which is not taken out of the delivery unit 14 yet and is to be taken out of the delivery unit 14 subsequently, needs to be delayed.

Thereafter, in the state that the simultaneous processing restricting control is performed, the operation of the substrate processing apparatus is carried on. The control device 4 measures an elapsed time from the beginning of the simultaneous processing restricting control while monitoring the state of the typical upper limit liquid-level sensor 54. If it is detected by the typical upper limit liquid-level sensor 54 that the liquid level within the tank 32 exceeds the typical upper limit liquid level L1 and if the elapsed time at the moment is equal to or less than a predetermined second reference time (e.g., 180 minutes) (YES in process S207), the simultaneous processing restricting control is not performed. That is, the number of the processing units 16 which perform the chemical liquid cleaning process at the same time is returned back to five from four (process S208). Furthermore, counting of the second reference time may be begun at the same time as counting of the first reference time is begun.

If the liquid level within the tank 32 does not reach the typical upper limit liquid level L1 even after 180 minutes has elapsed from the beginning of the simultaneous processing restricting control (NO in the process S207), the control device 4 sets off an alarm to notify the operator of occurrence of an abnormality in the substrate processing apparatus, and stops the operation of the substrate processing apparatus (process S209). As stated above, in the second exemplary embodiment, it is determined whether to perform the simultaneous processing restricting control based on the variation of the liquid level within the tank 32 with a lapse of time, which is detected by the liquid-level meter 50.

In the above-described first and second exemplary embodiments, the simultaneous processing restricting control is performed when the liquid supply 60 is not capable of supplying the processing liquid (diluted chemical liquid) as much as required by the plurality of processing units 16 due to the variation in the state of the factory power supply system or the like. Therefore, the substrate processing apparatus is capable of carrying on the stable operation. That is, the problems that the processing upon a single sheet of wafer W is stopped (this wafer W is highly likely to become faulty) or continuous operation of the substrate processing apparatus cannot but be stopped due to the exhaustion of the processing liquid from the tank 32 can be suppressed. In case that the continuous operation of the substrate processing apparatus is stopped due to the exhaustion of the processing liquid from the tank 32, great effort may be required to resume the operation of the substrate processing apparatus.

In the above-described exemplary embodiments, the circulation system is composed of the tank 32 and the circulation line 34, and the processing liquid is supplied into the processing units 16 from the circulation line 34. However, the exemplary embodiments are not limited thereto. The processing liquid may be supplied into the plurality of processing units 16 via a plurality of branch lines (not shown) branched from a main line (not shown) (not a circulation line) connected to the tank 32.

The chemical liquid supply system shown in FIG. 2 may be equipped with a chemical liquid recovery system configured to collect the chemical liquid supplied to the wafer W from each processing unit 16 and return the collected chemical liquid back into the tank 32. In this case, all the chemical liquids may not be reused, and a new chemical liquid needs to be replenished into the tank 32 regularly. Thus, the above-described exemplary embodiments have advantages.

A resolution to an insufficient DIW flow rate may be the same as that in the first exemplary embodiment. That is, while the liquid supply 60 is replenishing the chemical liquid (undiluted liquid+DIW) into the tank 32, for example, a DIW flow rate is detected by the flowmeter 64A, and a DIW average flow rate during the chemical liquid replenishment period is calculated. Even if the state of the flow rate control device 66A is set such that the maximum available flow rate is obtained, if the DIW average flow rate is less than a target value, a deviation from the target value is calculated, and the maximum available consumption rate is calculated based on this deviation. Then, it is determined whether to perform the simultaneous processing restricting control based on the maximum available consumption rate.

According to the exemplary embodiment, it is possible to appropriately respond to the situation in which the liquid supply cannot meet the processing liquid supply request from the processors. Thus, the operation of the substrate processing apparatus can be continuously carried on.

It should be noted that the above-described exemplary embodiments are nothing more than examples in all aspects and are not intended to be anyway limiting. The above-described exemplary embodiments can be implemented in various ways. Further, the exemplary embodiments can be omitted, replaced or modified in various ways without departing from the scope of the following claims.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A plasma processing apparatus, comprising:
   a storage configured to store a processing liquid therein;
   multiple processors each configured to perform a liquid processing on a substrate by using the processing liquid supplied from the storage;
   a liquid supply configured to supply, into the storage, at least a first liquid composed of the processing liquid or source liquids for composing the processing liquid;
   a detector configured to detect a value of a parameter indicating a state of the first liquid supplied from the liquid supply into the storage or a state of the processing liquid in the storage which is varied as the first liquid is supplied from the liquid supply; and
   a controller configured to control the multiple processors to perform the liquid processing in sequence, wherein the controller determines, based on a detection result of the value of the parameter detected by the detector, whether it is possible to supply the processing liquid continuously into a preset number of processors at the same time from the storage under a condition requested by the processors, and, when it is not possible, the controller performs a simultaneous processing restricting control of reducing a number of processors which are supposed to perform the liquid processing at the same time with the processing liquid supplied from the storage to be lower than the preset number.

2. The substrate processing apparatus of claim 1, wherein the detector detects, as the parameter, a temperature of the first liquid supplied from the liquid supply into the storage, and the controller determines whether to perform the simultaneous processing restricting control based on a deviation of an actual temperature of the first liquid detected by the detector from a target temperature.

3. The substrate processing apparatus of claim 2, wherein the controller calculates, based on the deviation of the actual temperature of the first liquid detected by the detector from the target temperature, a number of processors into which the processing liquid is allowed to be supplied at the same time at a processing liquid temperature and a processing liquid flow rate requested by the processors, and reduces the number of the processors supposed to perform the liquid processing at the same time to the calculated number.

4. The substrate processing apparatus of claim 2, wherein the liquid supply supplies a second liquid different from the first liquid into the storage in addition to the first liquid, and the processing liquid is composed as the first liquid and the second liquid are mixed.

5. The substrate processing apparatus of claim 4, wherein a supply amount of the first liquid into the storage by the liquid supply is larger than a supply amount of the second liquid.

6. The substrate processing apparatus of claim 4, wherein the second liquid contains a chemical liquid component, and the first liquid is a dilution liquid configured to dilute the second liquid.

7. The substrate processing apparatus of claim 2, wherein the controller starts the simultaneous processing restricting control by delaying a carry-in of the substrate into one of the processors which is supposed to be loaded with the substrate subsequently.

8. The substrate processing apparatus of claim 1, wherein the liquid supply supplies a second liquid different from the first liquid into the storage in addition to the first liquid, and the processing liquid is composed as the first liquid and the second liquid are mixed.

9. The substrate processing apparatus of claim 8, wherein a supply amount of the first liquid into the storage by the liquid supply is larger than a supply amount of the second liquid.

10. The substrate processing apparatus of claim 8, wherein the second liquid contains a chemical liquid component, and the first liquid is a dilution liquid configured to dilute the second liquid.

11. The substrate processing apparatus of claim 10, wherein the controller performs a liquid replenishment control of supplying the first liquid into the storage from the liquid supply when a liquid level of the processing liquid within the storage falls below a preset typical lower limit liquid level, and stopping the supplying of the first liquid into the storage from the liquid supply when the liquid level of the processing liquid within the storage exceeds a preset typical upper limit liquid level, and the controller performs the simultaneous processing restricting control when the liquid level of the processing liquid within the storage does not reach the typical upper limit liquid level even if the first liquid is supplied into the storage from the liquid supply for a preset first reference time after the liquid level of the processing liquid within the storage falls below the typical lower limit liquid level.

12. The substrate processing apparatus of claim 11, wherein the controller stops the simultaneous processing restricting control when the liquid level of the processing liquid within the storage reaches the typical upper limit liquid level within a preset second reference time after the simultaneous processing restricting control is begun.

13. The substrate processing apparatus of claim 1, wherein the detector detects, as the parameter, a liquid level of the processing liquid within the storage, and the controller determines whether to perform the simultaneous processing restricting control based on a variation of the detected liquid level with a lapse of time.

14. The substrate processing apparatus of claim 1, wherein the controller starts the simultaneous processing restricting control by delaying a carry-in of the substrate into one of the processors which is supposed to be loaded with the substrate subsequently.

15. The substrate processing apparatus of claim 1, wherein the simultaneous processing restricting control includes increasing a carry-in interval of the substrates which are respectively carried into the multiple processors in sequence.

16. The substrate processing apparatus of claim 1, wherein the controller immediately starts a carry-in of the substrate into one of the processors supposed to be loaded with the substrate subsequently when it is determined that there is no need to perform the simultaneous processing restricting control.

17. An operation method of a substrate processing apparatus equipped with a storage configured to store a processing liquid therein, multiple processors each configured to perform a liquid processing on a substrate with the processing liquid supplied from the storage and a liquid supply configured to supply, into the storage, at least a first liquid composed of the processing liquid or source liquids for composing the processing liquid, the operation method comprising:

allowing the multiple processors to perform a same liquid processing in sequence;

supplying the processing liquid into the storage by the liquid supply when a liquid level of the processing liquid stored in the storage decreases;

detecting a value of a parameter indicating a state of the first liquid which is supplied from the liquid supply into the storage or a state of the processing liquid in the storage which is varied as the first liquid is supplied from the liquid supply; and determining, based on a detection result of the detected value of the parameter, whether it is possible to supply the processing liquid continuously into a preset number of processors at the same time from the storage under a condition requested by the processors, and, when it is not possible, performing a simultaneous processing restricting control of reducing a number of processors which are supposed to perform the liquid processing at the same time with the processing liquid supplied from the storage to be lower than the preset number.

18. The operation method of claim 17,
wherein a temperature of the first liquid supplied from the liquid supply into the storage is detected as the parameter, and it is determined whether to perform the simultaneous processing restricting control based on a deviation of a detected actual temperature of the first liquid from a target temperature.

19. The operation method of claim 17,
wherein the liquid level of the processing liquid within the storage is detected as the parameter, and it is determined whether to perform the simultaneous processing restricting control based on a variation of the detected liquid level with a lapse of time.

* * * * *